United States Patent
Quadir et al.

(10) Patent No.: US 7,135,932 B2
(45) Date of Patent: Nov. 14, 2006

(54) TRANSIMPEDANCE AMPLIFIER

(75) Inventors: Nasir Abdul Quadir, Cyberjaya (MY); Farrah Azlin Binti Alias, Kuala Lumpur (MY); K. Selvarajah K. Krishnarajoo, Selangor (MY)

(73) Assignee: Sires Labs Sdn. Bhd. (MY)

( * ) Notice: Subject to any disclaimer, the term of this patent is extended or adjusted under 35 U.S.C. 154(b) by 618 days.

(21) Appl. No.: 10/615,725

(22) Filed: Jul. 8, 2003

(65) Prior Publication Data
US 2005/0007199 A1    Jan. 13, 2005

(51) Int. Cl.
*H03F 3/08* (2006.01)

(52) U.S. Cl. .................................. 330/308; 330/311

(58) Field of Classification Search ................ 330/308, 330/311, 310, 98, 150
See application file for complete search history.

(56) References Cited

U.S. PATENT DOCUMENTS

| | | | |
|---|---|---|---|
| 5,708,392 A | 1/1998 | Gross et al. | |
| 5,714,909 A | 2/1998 | Jackson | |
| 6,037,841 A | 3/2000 | Tanji et al. | |
| 6,275,114 B1 | 8/2001 | Tanji et al. | |
| 6,515,547 B1* | 2/2003 | Sowlati | 330/311 |
| 6,724,270 B1* | 4/2004 | Kozu | 331/117 R |

* cited by examiner

*Primary Examiner*—Henry Choe
(74) *Attorney, Agent, or Firm*—DeMont & Breyer, LLC

(57) ABSTRACT

A transimpedance amplifier, which is useful as an optical fiber preamplifier, is disclosed. The illustrative embodiment exhibits four characteristics. First, it minimizes the equivalent input noise current. Second, it has a wide bandwidth. Third, it has a reasonably large output voltage, and fourth, it is stable over wide temperature and voltage ranges. The illustrative embodiment comprises a transimpedance stage and a gain stage. Both stages employ a pure NMOS design which contributes to the above four advantages. Bandwidth is further increased over the prior art by the use of inductive loads. The inductive loads of the illustrative embodiment are not physical inductors, but transistor-based "active" inductors: the combination of a resistor connected in series with the gate of an NMOS transistor.

13 Claims, 8 Drawing Sheets

SCHEMATIC DIAGRAM OF THE REGULATED CASCODE (RGC) INPUT STAGE (a)

COMMON SOURCE STAGE AMPLIFIER (b)

HIGH FREQUENCY MODEL OF A COMMON SOURCE STAGE (a)

TYPICAL SHUNT PEAKED AMPLIFIER (b)

EQUIVALENT SMALL SIGNAL MODEL FOR CIRCUIT IN FIGURE 5a

GRAPH OF Zo VERSUS FREQUENCY (a) COMMON SOURCE STAGE WITH FEEDBACK RESISTOR (b) HIGH FREQUENCY MODEL FOR COMMON SOURCE STAGE WITH FEEDBACK RESISTOR

TRANSIMPEDANCE AMPLIFIER

FIELD OF THE INVENTION

The present invention relates to electronics in general, and, more particularly, to a transimpedance amplifier design.

BACKGROUND OF THE INVENTION

Modern optical telecommunications systems often employ optical fibers for carrying signals. Low-cost, high-performance, highly integrated fiber optic interface circuits are becoming increasingly necessary to meet the demands of high-speed digital data communication. One standard circuit function for fiber optic communication systems is a transimpedance amplifier that is used within an optical receiver.

FIG. 1 depicts an architectural diagram of a typical optical receiver. The light from an optical fiber 101 impinges on photodiode detector 102, producing a current IPD. Transimpedance amplifier 103 converts the very small currents indicative of optical signals applied to photodetector 102 into a large signal voltage, VTIA, which is further amplified by post amplifier 104 to voltage VPA for output to digital circuitry.

FIG. 2 depicts a schematic diagram of the transimpedance-input stage of a transimpedance amplifier in the prior art. An input current is injected into node 201. This current falls across input resistance RS and reverse-biased diode D1, both connected to power source $V_{SS}$. Node 201 is electrically connected to the gate terminal of NMOS transistor MB and the source of NMOS transistor M1. The gate terminal of transistor M1 is electrically connected to the drain terminal of transistor M2 and one terminal of resistor RB. The output of the circuit is terminal 202, which is electrically connected to the drain of transistor M1, and one terminal of resistor R1. The second terminal of resistor R1 is electrically connected to the second terminal of resistor RB and to power supply $V_{DD}$.

The feedback of the voltage at point 2 between transistor MB and resistor RB to the gate of transistor M1 serves to keep the biasing of the output voltage at point 3, $V_{OUT}$, stable. When the current of M1 increases, the voltage at point 3 increases and the drain current of MB increases. This causes the voltage at point 2 to decrease and this, in turn, causes the drain current of M1 to decrease to its previous value.

FIG. 3 depicts the small signal analysis of the circuit of FIG. 2 in the prior art. This analysis is for the circuit at mid-band, where parasitic capacitances are ignored. From FIG. 3a, the sum of the two transistor gate-to-source voltages is equal to the voltage drop across resistor RB, or $$V_{GS1}+V_{GSB}=-g_{mB}V_{GSB}RB \quad \text{(Eq. 1)}$$

FIG. 3a is rearranged in FIGS. 3b and 3c. FIG. 3b shows the dependent current source between nodes $V_{IN}$ and $V_{OUT}$ in FIG. 3a can be split into two dependent current sources to ground. From FIG. 3c-1 and equation (1), since $V_{GS1}=-V_{GSB}(1+g_{mB}RB)$, then the value of dependent current source is $-g_{m1}V_{GSB}(1+g_{mB}RB)$. Since the voltage across the current source is proportional to the current through the source by a factor of $V_{GSB}$, the current source, with polarity reversed, can be replaced by an equivalent resistor of value $1/(g_{m1}(1+g_{mB}RB))$. Also from FIG. 3c-1, $V_{GSB}=V_{IN}$, so $$V_{GSB}=RS \| 1/(g_{m1}(1+g_{mB}RB))I_{IN} \quad \text{(Eq. 2)}$$

$$Z_{IN}=RS \| 1/(g_{m1}(1+g_{mB}RB)) \approx 1/(g_{m1}(1+g_{mB}RB)) \quad \text{(Eq. 3)}$$

Thus, the input impedance is low, an ideal characteristic for an input current source represented by the photodetector.

From FIG. 3c-2:

$$V_{OUT} = -g_{m1}V_{GS1}R1 \quad \text{(Eq. 4)}$$
$$= -R1g_{m1}(-V_{GSB}(1+g_{sB}RB))$$
$$= R1I_{IN}g_{m1}[RS\|1/(g_{m1}(1+g_{mB}RB))](1+g_{mB}RB)$$
$$\approx I_{IN}RB$$

so that the transimpedance is:

$$V_{OUT}/I_{IN} \approx RB \quad \text{(Eq. 5)}$$

As the circuit operates at higher and higher frequencies, the parasitic capacitances of the transistors must be taken into consideration. They will have the effect of inducing poles into the transimpedance equation 4, thus reducing transimpedance gain.

Once the input current has been converted into a voltage by the transimpedance amplifier, it is often desirable to further amplify the voltage output. FIG. 4 depicts a typical common-source voltage amplifier circuit of the prior art. FIG. 4a is the circuit with input resistance RS connected to the gate of an NMOS transistor. The drain of the transistor is connected to a resistor RD at the output VOUT. RD is also connected to power supply VDD. FIG. 4b is the high frequency model of the common-source amplifier taking parasitic capacitance into effect across the terminals of the transistor. We obtain the transfer function of the voltage amplifier using nodal analysis:

$$\frac{V_X - V_{IN}}{R_S} + V_X s C_{gs} + (V_X - V_{OUT})sC_{gd} = 0 \quad \text{(Eq. 5)}$$

$$(V_{OUT} - V_X)sC_{gd} + g_m V_X + V_{OUT}\left(\frac{1}{R_D} + sC_{db}\right) = 0 \quad \text{(Eq. 6)}$$

From (6), $V_X$ can be expressed as $$V_x = \frac{V_{OUT}\left(sC_{gd} + \frac{1}{R_D} + sC_{db}\right)}{g_m - sC_{gd}} \quad \text{(Eq. 7)}$$

By substituting &7) into equation (5), the transfer function of the amplifier is:

$$\frac{V_{OUT}}{V_{IN}}(s) = \quad \text{(Eq. 8)}$$

$$\frac{(sC_{gd} - g_m)R_D}{R_S R_D \xi s^2 + [R_S(1+g_mR_D)C_{gd} + R_sC_{gs} + R_D(C_{gd}+C_{db})]s + 1}$$

And $\xi = C_{gs}C_{gd} + C_{gd}C_{db} + C_{gs}C_{db}$

By manipulating equation (8), the denominator can be expressed as:

$$D = \left(\frac{s}{\omega_{p1}} + 1\right)\left(\frac{s}{\omega_{p2}} + 1\right) = \frac{s^2}{\omega_{p1}\omega_{p2}} + \left(\frac{1}{\omega_{p1}} + \frac{1}{\omega_{p2}}\right)s + 1 \quad \text{(Eq. 9)}$$

The coefficient of s is approximately equal to $1/\omega_{p1}$ if $\omega_{p2}$ is much higher in frequency. It follows from equation (8) and (9) that the poles are located at:

$$\omega_{p1} = \frac{1}{R_S(1 + g_m R_D)C_{gd} + R_S C_{gs} + R_D(C_{gd} + C_{db})} \quad \text{(Eq. 10)}$$

and $$\omega_{p2} = \frac{R_S(1 + g_m R_D)C_{gd} + R_S C_{gs} + R_D(C_{gd} + C_{db})}{R_S R_D(C_{gs}C_{gd} + C_{gs}C_{db} + C_{gd}C_{db})} \quad \text{(Eq. 11)}$$

This analysis shows that the amplifier gain falls off at about 40 dB per decade of frequency at high frequencies, i.e. frequencies that are likely to be in the range of the data of the fiber optic receiver of FIG. 1.

To achieve higher bandwidth for the amplifier of FIG. 4 in the prior art, an inductance is introduced in series with the load resistor $R_D$. FIG. 5 shows what is called a shunt peaked amplifier of the prior art. FIG. 5a shows shows capacitance $C_o$ which includes all the capacitance at the output node. When the amplifier is used for a wideband application, inductance $L_S$ in series with resistance $R_D$ extends the bandwidth of the amplifier that is normally limited by the time constant $R_D C_o$, by introducing a zero as shown by the small signal analysis represented by the circuit of FIG. 5b as follows:

$$\frac{V_{OUT}}{V_{IN}} = \frac{g_m(R_D + j\omega L_S)}{1 + j\omega R_D C_o - \omega^2 L_S C_o} \quad \text{(Eq. 12)}$$

$$= \frac{g_m R_D(1 + j\omega\tau m)}{1 + j\omega\tau - \omega^2\tau^2 m}$$

Where $\tau = R_D C_o$ and $m = L_S/(R_D^2 C_o)$

In order to bring the resonance frequency close to the bandwidth of the fiber optic receiver of FIG. 1, the value of $L_S$ would be unrealistically high and therefore too large to fit on a typical integrated circuit.

SUMMARY OF THE INVENTION

The present invention provides a transimpedance amplifier, which is useful as an optical fiber preamplifier. The illustrative embodiment is advantageous in four ways. First, it minimizes the equivalent input noise current. Second, it has a wide bandwidth. Third, it has a reasonably large output voltage, and fourth, it is stable over wide temperature and voltage ranges.

The illustrative embodiment comprises a transimpedance stage and a gain stage. The transimpedance stage has a low input impedance to minimize input noise current. Both stages employ a pure NMOS design which contributes stability over temperature and power supply fluctuations. Gain is increased by the gain stage. Bandwidth is increased over the prior art by replacing R1 in FIG. 2 by an inductive load. A monolithic inductor on an integrated circuit is quite large, so instead of using a monolithic inductor, the illustrative embodiment employs an "active" inductor: the combination of a resistor connected in series with the gate of an NMOS transistor, where the potential at the drain of the NMOS transistor is held below that of the second terminal of the resistor by at least the threshold, or turn-on voltage, of the transistor. This transistor/resistor combination acts inductively at the data rates of interest. These active inductors are also employed in the gain stage of the illustrative embodiment to improve bandwidth.

The illustrative embodiment of the present invention comprises: a first transistor having a gate terminal, a drain terminal, and a source terminal; a first resistor having a first terminal and second terminal, wherein the first terminal of the first resistor is electrically connected to the gate terminal of the first transistor; and a second transistor having a gate terminal, a drain terminal, and a source terminal, wherein the drain terminal of the second transistor is electrically connected to the source terminal of the first transistor.

DETAILED DESCRIPTION

Figure 6:
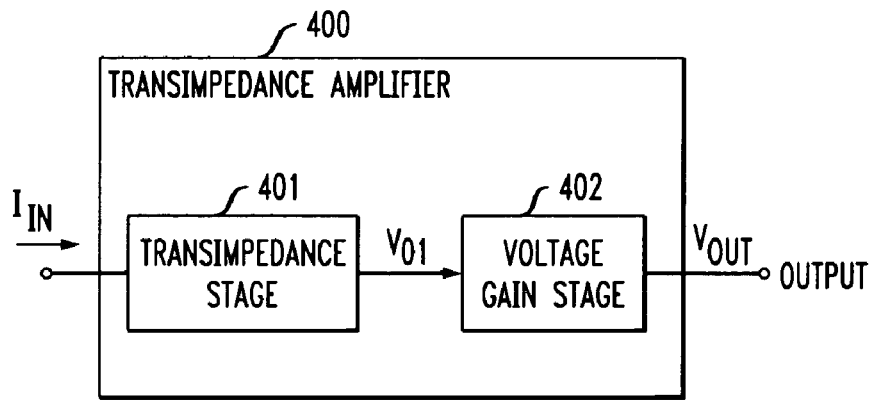
FIG. 6 depicts a block diagram of a transimpedance amplifier in accordance with the illustrative embodiment of the present invention.

FIG. 6 depicts a block diagram of a transimpedance amplifier in accordance with the illustrative embodiment of the present invention. The transimpedance amplifier 400 comprises transimpedance stage 401 and voltage gain stage 402.

Figure 7:
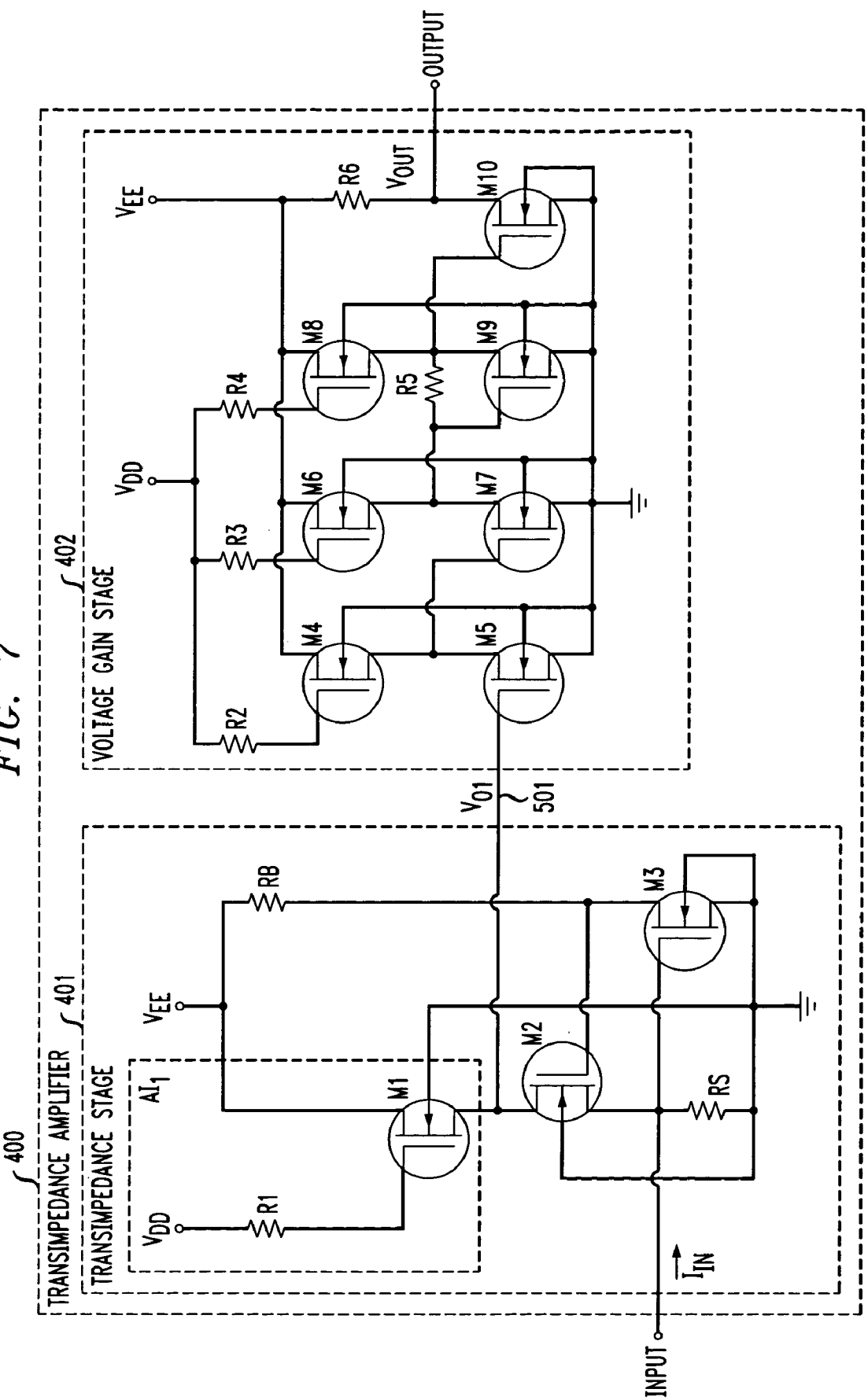
FIG. 7 depicts a schematic diagram of a transimpedance amplifier in accordance with the illustrative embodiment of the present invention.

FIG. 7 depicts a schematic diagram of a transimpedance amplifier in accordance with the illustrative embodiment of the present invention. The illustrative embodiment comprises: eight resistors, R1 through R6, RS, and RB, and ten transistors, M1 through M10. In accordance with the illustrative embodiment, transistors M1 through M10 are N-Type Enhancement mode transistors, as are well-known to those skilled in the art.

Transimpedance stage 401 has a terminal labeled INPUT into which the input current is injected. This INPUT terminal is electrically connected to the gate of transistor M3, the source of transistor M2, and one terminal of resistor RS. The second terminal of RS and the source terminal of transistor M3 are connected to ground potential. The gate terminal of transistor M2 is electrically connected to the drain terminal of transistor M3 and to one terminal of resistor RB. The drain terminal of transistor M2 is electrically connected to the source terminal of transistor M1. The drain terminal of transistor M1 is electrically connected to the second terminal of resistor RB and to a supply voltage $V_{EE}$. The gate terminal of transistor M1 is electrically connected to one terminal of resistor R1, while the second terminal of resistor R1 is electrically connected to a second voltage supply $V_{DD}$. Resistor R1 and transistor M1 comprise active inductor $AI_1$, to be described in FIG. 6 below. All the substrate terminals of transistors M1 through M3 are connected to the lowest potential, which is ground potential.

Figure 1:
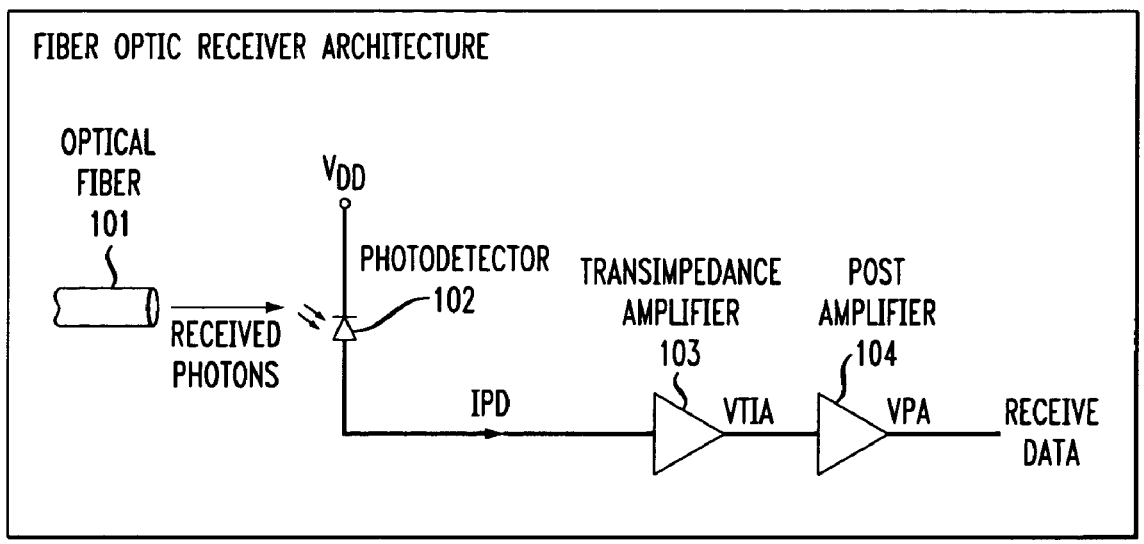
FIG. 1 depicts an architectural diagram of a typical optical receiver.
Figure 2:
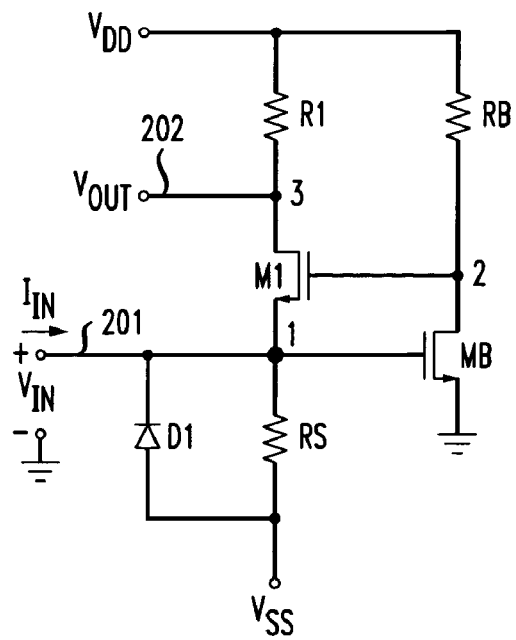
FIG. 2 depicts a schematic of the transimpedance-input stage of a transimpedance amplifier of the prior art.
Figure 3:
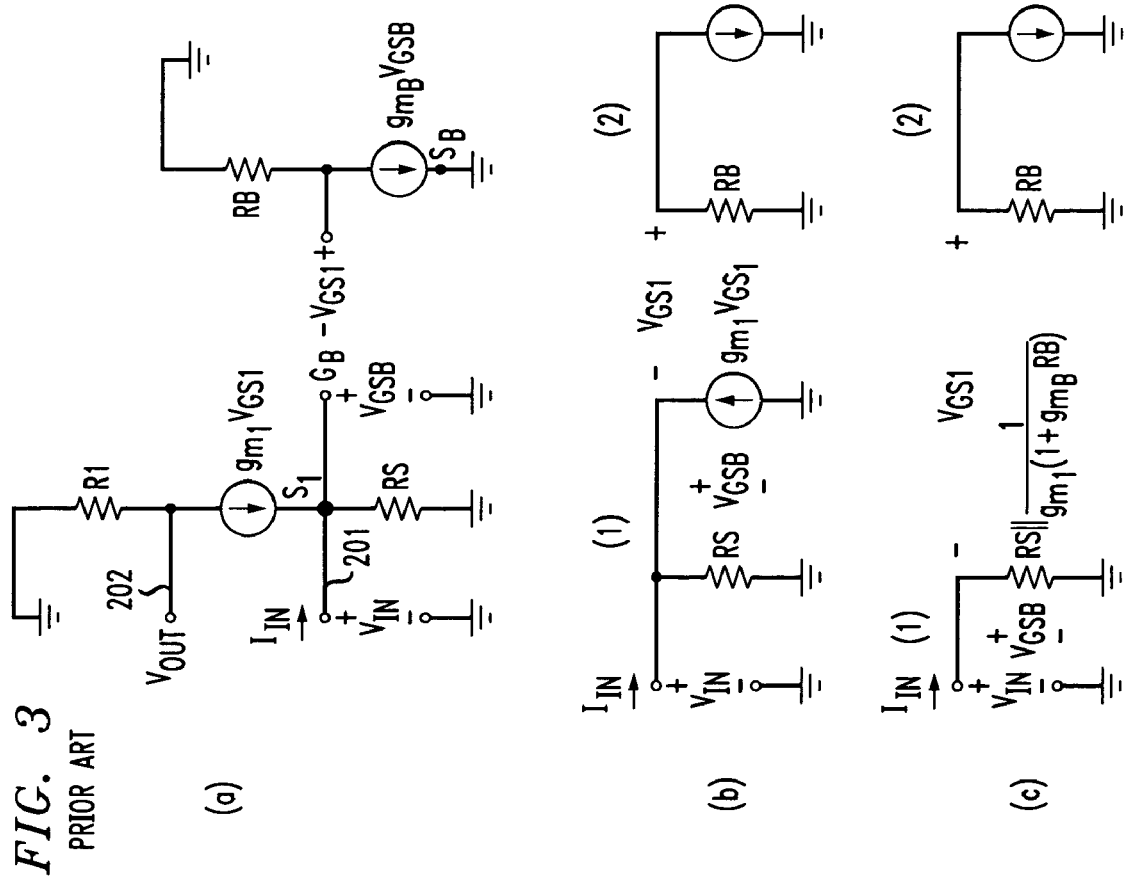
FIG. 3 depicts the small signal analysis of the circuit of FIG. 2 of the prior art.
Figure 4:
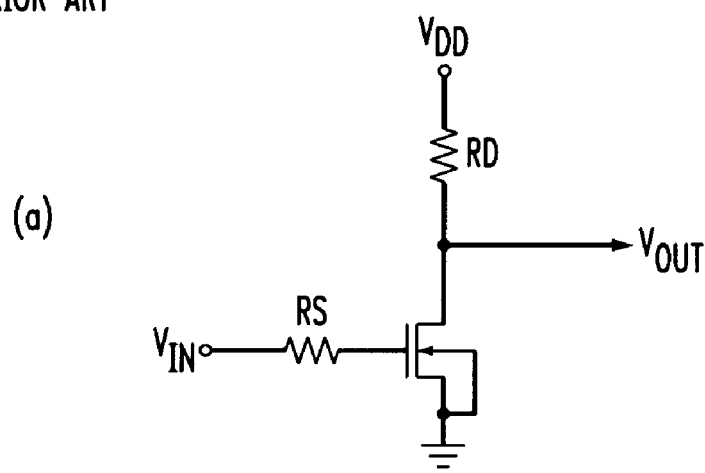
FIG. 4 depicts a typical common-source voltage amplifier circuit of the prior art.
Figure 4:
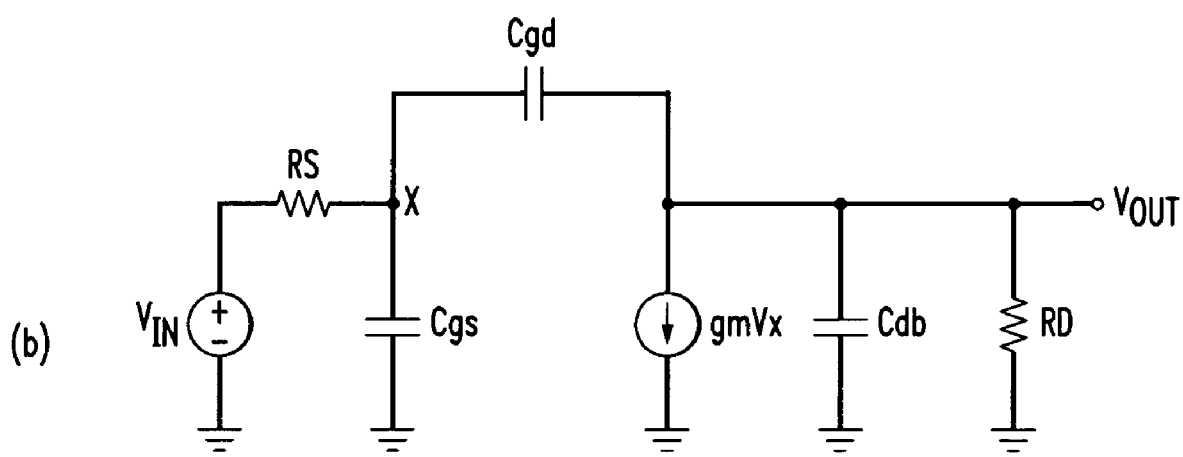

Notice that active inductor $AI_1$, if represented by an impedance $Z_1$, creates a circuit that closely resembles that of FIG. 2, with $Z_1$ replacing R1 of FIG. 2, M2 replacing M1 of FIG. 2, M3 replacing MB of FIG. 2, $V_{SS}$ connected to ground potential, and diode D1 removed. Thus, the transconductance of stage 401 at mid-band frequencies, ignoring parasitic capacitances, is just $Z_1$, the impedance of active inductor $AI_1$, thereby increasing bandwidth.

The output terminal 501 of the transimpedance stage feeds voltage gain stage 402, electrically connected to the gate of transistor M5. Voltage gain stage 402 comprises common source voltage gain stages, with drain resistors replaced by active inductor pairs R2/M4, R3/M6, and R4/M8. The active inductor pairs of gain stage 402 serve to increase bandwidth. The source terminals of NMOS transistors M5, M7, M9, and M10 are all connected to each other and ground potential. The substrate terminals of NMOS transistors M4 through M10 are also connected to ground potential. The first terminal of each of resistors R2, R3, and R4 are electrically connected to power supply $V_{DD}$. The drain terminals of each of transistors M4, M6, and M8 are connected to a second power supply $V_{EE}$.

The source terminal of transistor M4 is electrically connected to the drain terminal of transistor M5 and to the gate terminal of transistor M7. The gate terminal of transistor M4 is connected to the second terminal of resistor R2. The drain terminal of transistor M7 is electrically connected to the source terminal of transistor M6, to the gate terminal of transistor M9, and to the first terminal of resistor R5. The gate terminal of transistor M6 is electrically connected to the second terminal of resistor R3. The drain terminal of transistor M9 is electrically connected to the source terminal of transistor M8, to the second terminal of resistor R5, and to the gate terminal of transistor M10. The gate terminal of transistor M8 is electrically connected to the second terminal of resistor R4. The drain terminal of transistor M10 is electrically connected to the first terminal of resistor R6 and to the OUTPUT terminal of gain stage 402, which is the output terminal of the entire transimpedance amplifier. The second terminal of resistor R6 is electrically connected to the supply voltage $V_{EE}$.

Figure 5:
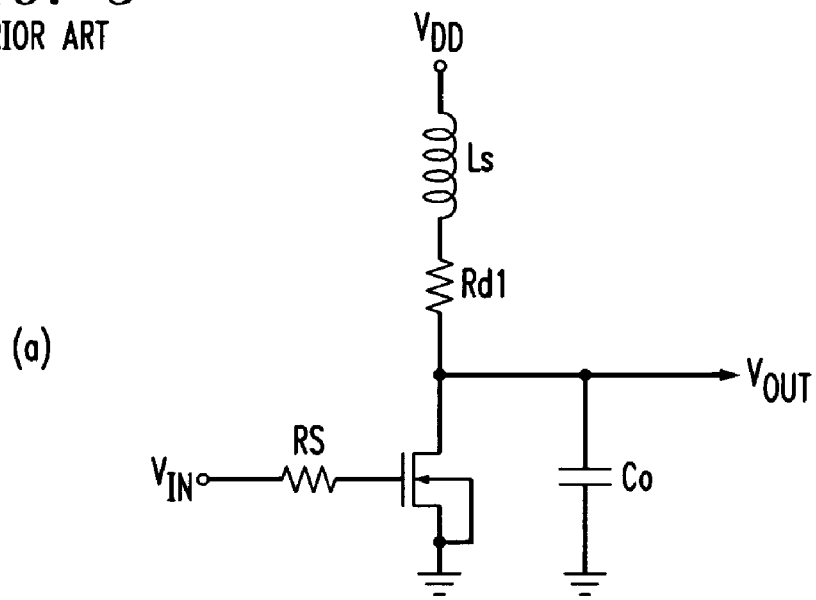
FIG. 5 shows what is called a shunt peaked amplifier of the prior art.
Figure 5:
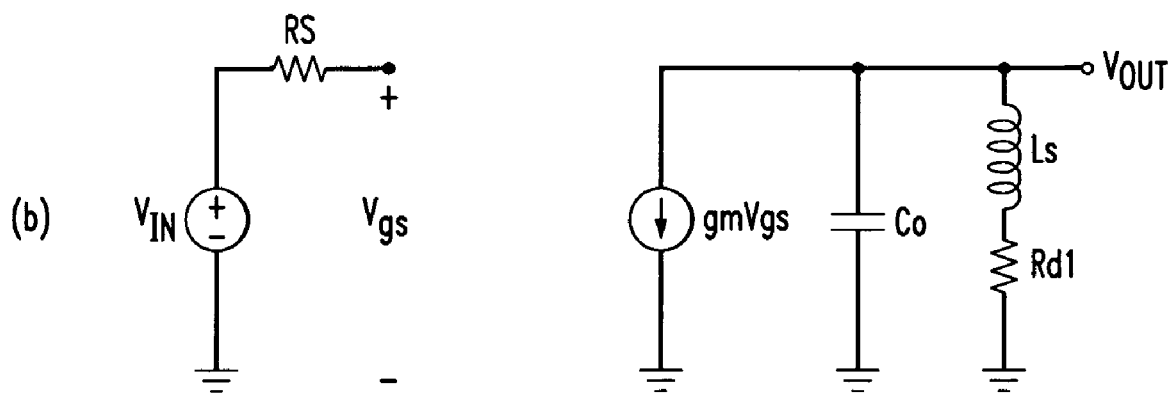

The illustrative embodiment comprises "active inductors," which are CMOS-based designs that function as a real inductor in the circuit. While inductors can be used in IC design to enhance the bandwidth of the circuit, a "real" inductor is disadvantageous to implement on an integrated circuit. As a consequence, active inductors are used for the same purpose. In FIG. 7, the passive inductor that would appear at the drain terminals of transistors M1, M5, M7, and M9 in series with resistances, as described in FIG. 5 of the prior art, are replaced by active inductors. Note that the potential at the drain of the NMOS transistor, $V_{EE}$ is held below that of the second terminal of the resistor $V_{DD}$ by at least the threshold, or turn-on voltage, of the transistor. For the illustrative embodiment of the present invention, $V_{DD}$ is about 3.3 Volts, and $V_{EE}$ is about 1.8 Volts. It should be clear to those skilled in the art that other supply voltages are possible.

Figure 8:
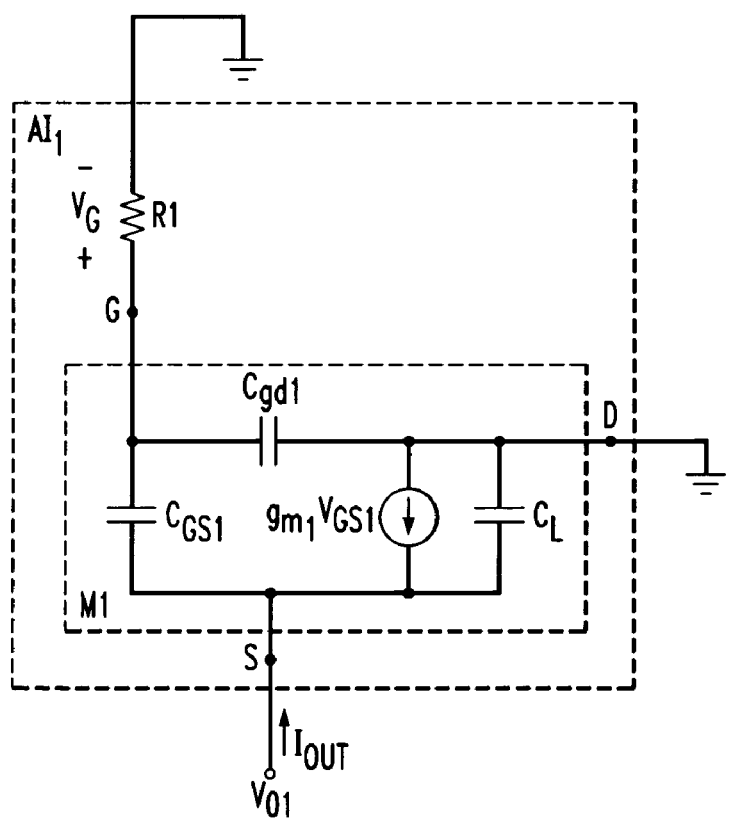
FIG. 8 depicts schematics of the small signal model for the active inductors of FIG. 5.

FIG. 8 depicts schematics of the small signal model for the active inductors of FIG. 7. FIG. 8 represents active inductor $AI_1$ of FIG. 7, but the analysis for active inductor pairs R2/M4, R3/M6, and R4/M9 are the same. The DC power supply rails $V_{DD}$ and $V_{EE}$ have been replaced by AC ground potentials. At node $V_g$, we have $$sC_{gs1}(V_g - V_{o1}) + \frac{V_g}{R1} + V_g s C_{gd1} = 0 \quad \text{(Eq. 13)}$$

Rearranging slightly, we have $$V_g = \frac{sC_{gs1}R1V_{o1}}{1 + sR1(C_{gs1} + C_{gd1})} \quad \text{(Eq. 14)}$$

At node $V_{OUT}^-$, $$I_{o1} = g_{m1}(V_g - V_{o1}) + (V_g - V_{o1})sC_{gs1} - V_{o1}sC_L \quad \text{(Eq. 15)}$$

Solving (14) and (15), we have $$Z_o = \frac{V_{o1}}{I_o} \quad \text{(Eq. 16)}$$

$$= \left[ \frac{1 + sR1(C_{gs1} + C_{gd1})}{[R1(C_{gd1}C_{gs1} + C_{gs1}C_L + C_{gd1}C_L)]s^2 + [(C_{gs1} + C_L + g_{m1}R1C_{gd1})]s + g_{m1}} \right]$$

From equation (16) the poles (18 and 19) and zero (17) can be identified as:

$$Z_1 = \frac{1}{R1(C_{gs1} + C_{gd})} \quad \text{(Eq. 17)}$$

$$P_1 = \frac{g_{m1}}{C_{gs1} + C_L + g_{m1}R1C_{gd1}} \quad \text{(Eq. 18)}$$

$$P_2 = \frac{C_{gs1} + C_L + C_{gd1}}{R1(C_{gs1}C_{gd1} + C_LC_{gd1} + C_LC_{gs1})} \quad \text{(Eq. 19)}$$

Figure 9:
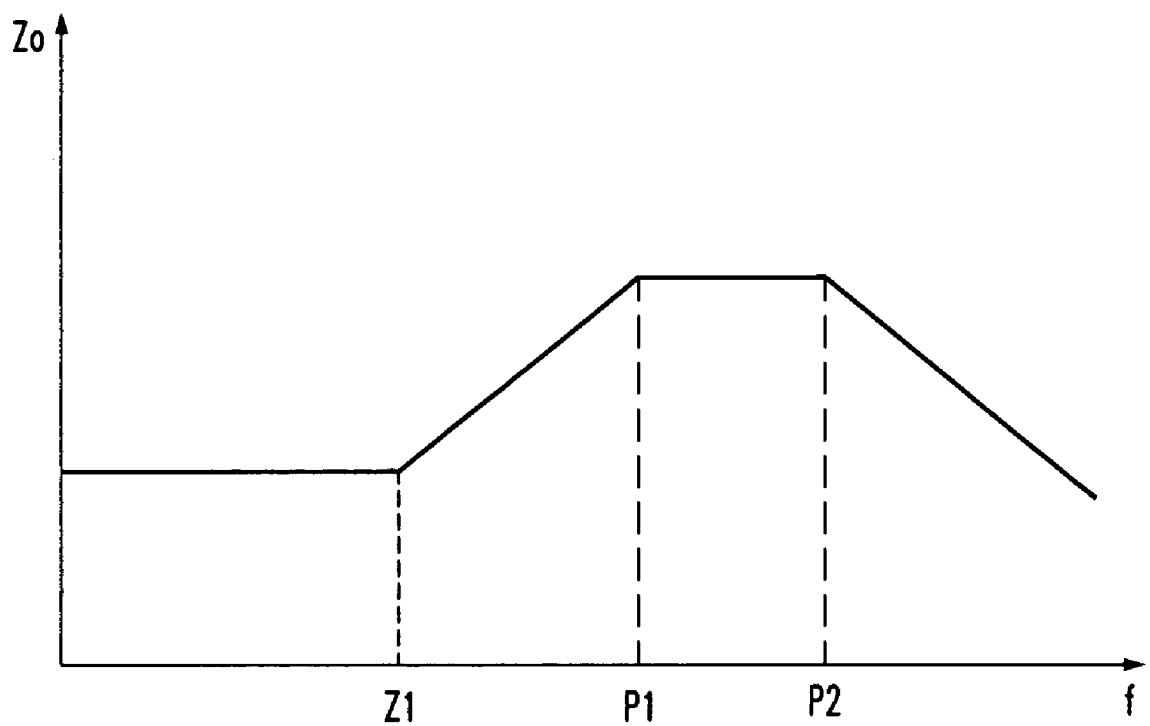
FIG. 9 depicts a bode-plot of the magnitude of $Z_o$ as a function of frequency.

FIG. 9 depicts a bode-plot of the magnitude of $Z_o$ as a function of frequency. In the range of frequency between $Z_1$ and $P_1$, the active inductor induces a zero, increasing gain with frequency, similar in function to a real inductor. The active inductor introduces inductive impedance as a load at the data rates of interest.

Figure 10:
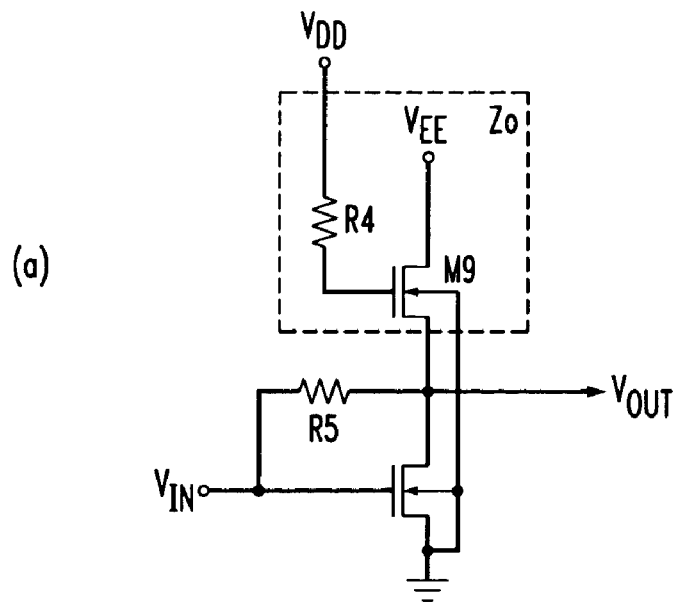
FIG. 10 shows a common source amplifier stage with active inductor load and feedback resistor of the current embodiment of the present invention.
Figure 10:
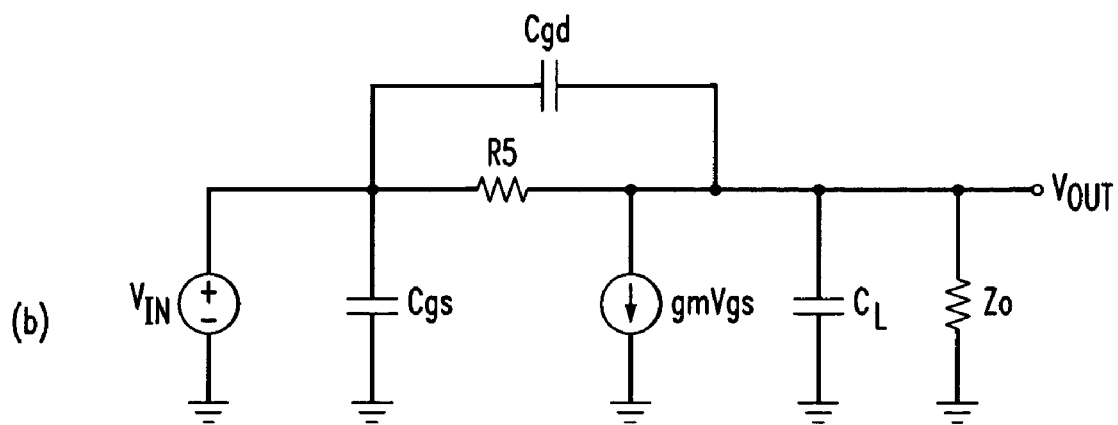

FIG. 10 shows a common source amplifier stage with active inductor load and feedback resistor of the current embodiment of the present invention. FIG. 10a shows the common source amplifier with feedback sub-circuit, while FIG. 10b is the high frequency model for this sub-circuit. At node $V_{OUT}$, $$(V_{OUT} - V_{in})sC_{gd} + \frac{(V_{OUT} - V_{IN})}{R_5} + g_m V_{gs} + \frac{V_{OUT}}{Z_o} + sC_L V_{OUT} = 0 \quad \text{(Eq. 20)}$$

And $V_{IN}=V_{GS}$. Solving (20), we have $$\frac{V_{OUT}}{V_{IN}} = \frac{(1 - g_m R_5 + sC_{gd}R_5)}{\left(1 + \frac{R_5}{Z_o} + sC_{gd}R_5 + sC_L R_5\right)} \quad \text{(Eq. 21)}$$

Feedback resistor R5 provides better stability and more linear operation of the common source amplifier than if the amplifier did not have feedback.

The values of resistors R1 through R6, RB, and RS are shown in Table 1.

TABLE 1

Values of Resistors R1 through R8

| Device | Value |
|---|---|
| R1 | 1 KΩ |
| R2 | 2 KΩ |
| R3 | 1.8 KΩ |
| R4 | 700 Ω |
| R5 | 1.5 KΩ |
| R6 | 200 Ω |
| RB | 400 Ω |
| RS | 500 Ω |

The dimensions of transistors M1 through M10 are shown in Table 2.

TABLE 2

Dimensions of Transistors M1 through 10

| Device | Dimension |
|---|---|
| M1 | W = 5 μm L = 0.18 μm |
| M2 | W = 24 μm L = 0.18 μm |
| M3 | W = 12 μm L = 0.18 μm |
| M4 | W = 18 μm L = 0.18 μm |
| M5 | W = 28 μm L = 0.18 μm |
| M6 | W = 8 μm L = 0.18 μm |
| M7 | W = 30 μm L = 0.18 μm |
| M8 | W = 8 μm L = 0.18 μm |
| M9 | W = 30 μm L = 0.18 μm |
| M10 | W = 16 μm L = 0.18 μm |

All ten of the transistors are NMOS because the mobility of electrons in NMOS is greater than the mobility of holes in PMOS. It will be clear to those skilled in the art how to make and use embodiments of the present invention.

It is to be understood that the above-described embodiments are merely illustrative of the present invention and that many variations of the above-described embodiments can be devised by those skilled in the art without departing from the scope of the invention. It is therefore intended that such variations be included within the scope of the following claims and their equivalents.

What is claimed is:

1. An apparatus comprising:
   a first transistor having a gate terminal, a drain terminal, and a source terminal;
   a first resistor having a first terminal and second terminal, wherein said first terminal of said first resistor is electrically connected to said gate terminal of said first transistor;
   a second transistor having a gate terminal, a drain terminal, and a source terminal, wherein said drain terminal of said second transistor is electrically connected to said source terminal of said first transistor; and
   a second resistor having a first and a second terminal, wherein said first terminal of said second resistor is electrically connected to said gate terminal of said second transistor, and wherein said second terminal of said second resistor is electrically connected to said drain terminal of said first transistor;
   wherein a first voltage connected to said second terminal of said first resistor is greater than a second voltage connected to said drain terminal of said first transistor by at least the gate-to-source threshold voltage of said first transistor.

2. An apparatus comprising:
   a first transistor having a gate terminal, a drain terminal, and a source terminal;
   a first resistor having a first terminal and second terminal, wherein said first terminal of said first resistor is electrically connected to said gate terminal of said first transistor;
   a second transistor having a gate terminal, a drain terminal, and a source terminal, wherein said drain terminal of said second transistor is electrically connected to said source terminal of said first transistor; and
   a second resistor having a first and a second terminal, wherein said first terminal of said second resistor is electrically connected to said gate terminal of said second transistor, and wherein said second terminal of said second resistor is electrically connected to said drain terminal of said first transistor;
   wherein said first transistor further comprises a first substrate terminal and said second transistor further comprises a second substrate terminal wherein said first substrate terminal and said second substrate terminal are electrically connected to each other.

3. The apparatus of claim 2 wherein said first substrate is connected to a ground voltage.

4. The apparatus of claim 2 further comprising:
   a third resistor having a first and second terminals, wherein said first terminal of said third resistor is electrically connected to said source terminal of said second transistor and said second terminal of said third resistor is electrically connected to said substrate of said first transistor;
   a third transistor having a gate terminal, drain terminal, source terminal, and substrate terminal, wherein said drain terminal of said third transistor is electrically connected to said gate terminal of said second transistor, and wherein said substrate terminal of said third transistor is electrically connected to said source terminal of said third transistor and to said substrate terminal of said first transistor.

5. The apparatus of claim 4 wherein said first transistor, said second transistor, and said third transistor are n-type enhancement mode field effect transistors.

6. An apparatus comprising:
   a first transistor having a gate terminal, a drain terminal, and source terminal;
   a second transistor having a gate terminal, a drain terminal, and a source terminal, wherein said source terminal of said first transistor is electrically connected to said drain terminal of said second transistor;
   a first resistor having a first terminal and second terminal, wherein said first terminal of said first resistor is electrically connected to said gate terminal of said first transistor;

a second resistor having a first terminal and second terminal, wherein said first terminal of said second resistor is electrically connected to said drain terminal of said second transistor, and wherein said second terminal of said second resistor is electrically connected to said gate terminal of said second transistor;

a third transistor having a gate terminal, a drain terminal, and a source terminal, wherein said source terminal of said third transistor is electrically connected to said source terminal of said second transistor, and wherein said drain terminal of said third transistor is electrically connected to said first terminal of said second resistor;

a fourth transistor having a gate terminal, a drain terminal, and a source terminal, wherein said source terminal of said fourth transistor is electrically connected to said drain terminal of said third transistor, and wherein said drain terminal of said fourth transistor is electrically connected to said drain terminal of said first transistor; and a third resistor having a first terminal and second terminal, wherein said first terminal of said third resistor is electrically connected to said gate terminal of said fourth transistor, and wherein said second terminal of said third resistor is electrically connected to said second terminal of said first resistor.

7. An apparatus comprising:
a first transistor having a gate terminal, a drain terminal, and source terminal;
a second transistor having a gate terminal, a drain terminal, and a source terminal, wherein said source terminal of said first transistor is electrically connected to said drain terminal of said second transistor;
a first resistor having a first terminal and second terminal, wherein said first terminal of said first resistor is electrically connected to said gate terminal of said first transistor; and
a second resistor having a first terminal and second terminal, wherein said first terminal of said second resistor is electrically connected to said drain terminal of said second transistor, and wherein said second terminal of said second resistor is electrically connected to said gate terminal of said second transistor;
wherein a first voltage connected to said second terminal of said first resistor is greater than a second voltage connected to said drain terminal of said first transistor by at least the gate-to-source threshold voltage of said first transistor.

8. The apparatus of claim 6:
wherein said first transistor further comprises a substrate terminal,
wherein said second transistor further comprises a substrate terminal,
wherein said third transistor further comprises a substrate terminal,
wherein said fourth transistor further comprises a substrate terminal,
wherein said substrate terminal of said first transistor is electrically connected to said source terminal of said second transistor,
wherein said substrate terminal of said second transistor is electrically connected to said source terminal of said second transistor,
wherein said substrate terminal of said third transistor is electrically connected to said source terminal of said third transistor, and
wherein said substrate terminal of said fourth transistor is electrically connected to said source terminal of said third transistor.

9. The apparatus of claim 8 wherein said first substrate is connected to a ground voltage.

10. The apparatus of claim 8 further comprising
a fifth transistor having a gate terminal, a drain terminal, a source terminal, and a substrate terminal, wherein said drain terminal of said fifth transistor is electrically connected to said gate terminal of said third transistor, and wherein said substrate terminal of said fifth transistor is electrically connected to said source terminal of said third transistor;

a sixth transistor having a gate terminal, a drain terminal, a source terminal, and a substrate terminal, wherein said drain terminal of said sixth transistor is electrically connected to said drain terminal of said fourth transistor, wherein said source terminal of said sixth transistor is electrically connected to said drain terminal of said fifth transistor, and wherein said substrate terminal of said sixth transistor is electrically connected to said source terminal of said fifth transistor; and a fourth resistor having a first terminal and a second terminal, wherein said first terminal of said fourth resistor is electrically connected to said gate terminal of said sixth transistor, and wherein said second terminal of said fourth resistor is electrically connected to said second terminal of said first resistor.

11. The apparatus of claim 10 further comprising
a seventh transistor having a gate terminal, a drain terminal, a source terminal, and a substrate terminal, wherein said source terminal of said seventh transistor is electrically connected to said source terminal of said second transistor, wherein said gate terminal of said seventh transistor is electrically connected to said drain terminal of said second transistor, and wherein said substrate terminal of said seventh transistor is electrically connected to said source terminal of said seventh transistor; and a fifth resistor having a first terminal and second terminal, wherein said first terminal of said fifth resistor is electrically connected to said drain terminal of said seventh transistor, and wherein said second terminal of said fifth resistor is electrically connected to said drain terminal of said fourth transistor.

12. The apparatus of claim 11 wherein said first transistor, said second transistor, said third transistor, said fourth transistor, said fifth transistor, said sixth transistor, and said seventh transistor are n-type enhancement mode field effect transistors.

13. The apparatus of claim 12 wherein said source terminal of said second transistor is connected to a ground voltage.

* * * * *